United States Patent
Liu et al.

(10) Patent No.: US 12,171,126 B2
(45) Date of Patent: Dec. 17, 2024

(54) DISPLAY SUBSTRATE, MANUFACTURING METHOD THEREOF, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Ning Liu, Beijing (CN); Dacheng Zhang, Beijing (CN); Tong Wu, Beijing (CN); Jun Liu, Beijing (CN); Qinghe Wang, Beijing (CN); Yang Zhang, Beijing (CN); Bin Zhou, Beijing (CN); Liangchen Yan, Beijing (CN); Huadong Wang, Beijing (CN); Chongchong Liu, Beijing (CN); Jie Zhang, Beijing (CN)

(73) Assignees: HEFEI XINSHENG OPTOELECTRONICS TECHNOLOGY GROUP CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 308 days.

(21) Appl. No.: 17/637,504

(22) PCT Filed: Mar. 31, 2021

(86) PCT No.: PCT/CN2021/084446
§ 371 (c)(1),
(2) Date: Feb. 23, 2022

(87) PCT Pub. No.: WO2022/205083
PCT Pub. Date: Oct. 6, 2022

(65) Prior Publication Data
US 2023/0337496 A1 Oct. 19, 2023

(51) Int. Cl.
*H10K 59/131* (2023.01)
*H10K 59/12* (2023.01)
*H10K 71/20* (2023.01)

(52) U.S. Cl.
CPC ..... *H10K 59/1315* (2023.02); *H10K 59/1201* (2023.02); *H10K 71/231* (2023.02)

(58) Field of Classification Search
CPC ........... H10K 59/1315; H10K 59/1201; H10K 71/231; H10K 59/80; H10K 77/10; H10K 59/126; H10K 59/131
See application file for complete search history.

(56) References Cited

U.S. PATENT DOCUMENTS

| 8,729,794 B2 | 5/2014 | Hasegawa et al. |
| 9,674,946 B2 | 6/2017 | Fujino et al. |

(Continued)

FOREIGN PATENT DOCUMENTS

| CN | 101315945 A | 12/2008 |
| CN | 202142534 U | 2/2012 |

(Continued)

*Primary Examiner* — Bitew A Dinke
(74) *Attorney, Agent, or Firm* — Dilworth & Barrese, LLP.; Michael J. Musella, Esq.

(57) ABSTRACT

A display substrate, a manufacturing method thereof, and a display device are provided. The display substrate includes a base substrate, organic light-emitting elements, a data line, and an electrode line. The organic light-emitting element includes a first electrode, a light-emitting layer and a second electrode sequentially stacked; the data line is located between the base substrate and the organic light-emitting element; the electrode line is on the same layer as the data line and located in a region outside a light-emitting region of the organic light-emitting element. The display substrate further includes at least one connection portion, which is in the region outside the light-emitting region and is configured to connect the electrode line and the first electrode, the (Continued)

connection portion is spaced apart from the second electrode, and the light-emitting layer covers the second electrode and the at least one connection portion.

19 Claims, 6 Drawing Sheets

(56) References Cited

U.S. PATENT DOCUMENTS

| | | | |
|---|---|---|---|
| 10,510,818 B2 | 12/2019 | Lu | |
| 11,245,101 B2 | 2/2022 | Sun et al. | |
| 11,778,847 B2 * | 10/2023 | Song | H10K 59/122 |
| 2010/0060147 A1 * | 3/2010 | Eom | H10K 59/80522 |
| | | | 313/504 |
| 2010/0127264 A1 * | 5/2010 | Bang | H10K 50/824 |
| | | | 438/151 |
| 2017/0033166 A1 * | 2/2017 | Shim | H10K 59/1315 |
| 2018/0006106 A1 * | 1/2018 | Oh | H10K 59/1216 |
| 2018/0122876 A1 * | 5/2018 | Shim | H10K 59/131 |
| 2018/0190934 A1 * | 7/2018 | Choi | H10K 50/824 |
| 2019/0103575 A1 * | 4/2019 | Park | H10K 50/17 |
| 2019/0115403 A1 * | 4/2019 | Kang | H01L 27/124 |
| 2019/0165305 A1 * | 5/2019 | Zhang | H10K 59/80521 |
| 2019/0172895 A1 * | 6/2019 | Liu | G09G 3/2003 |
| 2020/0119126 A1 * | 4/2020 | Jo | H10K 59/131 |
| 2022/0037616 A1 | 2/2022 | Liu et al. | |
| 2022/0093894 A1 | 3/2022 | Song et al. | |
| 2023/0200128 A1 * | 6/2023 | Su | H10K 77/10 |
| | | | 257/40 |

FOREIGN PATENT DOCUMENTS

| | | | | |
|---|---|---|---|---|
| CN | 108538890 A | | 9/2018 | |
| CN | 109004093 A | | 12/2018 | |
| CN | 110911461 A | | 3/2020 | |
| CN | 111864116 A | | 10/2020 | |
| CN | 112103326 A | * | 12/2020 | H01L 27/3244 |
| KR | 10-2018414 B1 | | 9/2019 | |

* cited by examiner

DISPLAY SUBSTRATE, MANUFACTURING METHOD THEREOF, AND DISPLAY DEVICE

TECHNICAL FIELD

At least one embodiment of the present disclosure relates to a display substrate, a manufacturing method thereof, and a display device.

BACKGROUND

At present, transparent display products include a top-emitting organic light-emitting diode, and the thin thickness of a transparent cathode in the top-emitting organic light-emitting diode can improve the transparency effect. The transparent display products have obvious advantages, such as a clear picture quality, a vivid display effect, etc., and can be widely used in a car display environment, such as an automobile, a subway, etc., and a window display environment, such as a hotels, a clothing store, etc.

SUMMARY

At least one embodiment of the present disclosure provides a display substrate, a manufacturing method thereof, and a display device.

At least one embodiment of the present disclosure provides a display substrate, including a base substrate, and a plurality of organic light-emitting elements, a data line and an electrode line on the base substrate. Each organic light-emitting element includes a first electrode, a light-emitting layer and a second electrode which are sequentially stacked along a direction perpendicular to the base substrate, and the second electrode is on a side of the light-emitting layer facing the base substrate; the data line is between the base substrate and the organic light-emitting element, and extends along a first direction; the electrode line is on the same layer as the data line and in a region outside a light-emitting region of the organic light-emitting element. The display substrate further includes at least one connection portion, which is in the region outside the light-emitting region and is configured to connect the electrode line and the first electrode, the connection portion is spaced apart from the second electrode, and the light-emitting layer covers the second electrode and the at least one connection portion.

For example, in embodiments of the present disclosure, the light-emitting layer is disconnected at a side edge of the connection portion, and the first electrode is connected to the connection portion through a gap where the light-emitting layer is disconnected.

For example, in embodiments of the present disclosure, the first electrode is a transparent electrode, and the connection portion includes a first conductive layer and a second conductive layer which are stacked in the direction perpendicular to the base substrate and are made of different materials, and the first conductive layer is on a side of the second conductive layer away from the base substrate; and in a second direction intersecting with the first direction and parallel to the base substrate, a size of the first conductive layer is greater than a size of the second conductive layer, the light-emitting layer is disconnected at a side edge of the first conductive layer, and the first electrode is connected to the connection portion through a gap where the light-emitting layer is disconnected.

For example, in embodiments of the present disclosure, the connection portion further includes a third conductive layer on a side of the second conductive layer facing the base substrate, a material of the third conductive layer is different from the material of the second conductive layer, and the first electrode is at least partially connected to a portion, which is not covered by the second conductive layer, of a surface of the third conductive layer away from the base substrate.

For example, in embodiments of the present disclosure, in the second direction, a size of the third conductive layer is greater than the size of the second conductive layer.

For example, in embodiments of the present disclosure, in the second direction, a size of the third conductive layer is greater than the size of the first conductive layer.

For example, in embodiments of the present disclosure, the first electrode is connected to the surface of the third conductive layer away from the base substrate and a side surface of the second conductive layer.

For example, in embodiments of the present disclosure, the connection portion further includes a fourth film layer between the first conductive layer and the second conductive layer, and a material of the fourth film layer is different from the material of the second conductive layer and the material of the first conductive layer; and in the second direction, a size of the fourth film layer is not greater than the size of the first conductive layer and greater than the size of the second conductive layer.

For example, in embodiments of the present disclosure, the fourth film layer is a conductive layer, and the size of the fourth film layer is smaller than the size of the first conductive layer in the second direction.

For example, in embodiments of the present disclosure, a thickness of the fourth film layer is not less than ½ of a thickness of the first conductive layer.

For example, in embodiments of the present disclosure, in the direction perpendicular to the base substrate, the second conductive layer overlaps a middle region of the first conductive layer, and in the second direction, a difference between the size of the first conductive layer and the size of the second conductive layer ranges from 0.6 to 4 microns.

For example, in embodiments of the present disclosure, in the direction perpendicular to the base substrate, a thickness of the second conductive layer is greater than a thickness of the light-emitting layer.

For example, in embodiments of the present disclosure, the display substrate further includes: an insulation layer between the third conductive layer and the electrode line. The insulation layer is provided with a via hole, and the third conductive layer is connected to the electrode line through the via hole.

For example, in embodiments of the present disclosure, the second electrode of the organic light-emitting element includes at least two electrode layers, and the first conductive layer and the second conductive layer are respectively in the same layer as the two electrode layers of the second electrode and insulated with each other.

For example, in embodiments of the present disclosure, the display substrate further includes: a pixel defining layer including a plurality of openings to define a plurality of light-emitting regions, the light-emitting layer covers the pixel defining layer and the plurality of openings. The pixel defining layer is between the second electrode and the connection portion, and a certain distance is between the first conductive layer and the pixel defining layer in the second direction.

For example, in embodiments of the present disclosure, in the direction perpendicular to the base substrate, an edge portion of the third conductive layer overlaps the pixel defining layer.

For example, in embodiments of the present disclosure, the display substrate further includes: a gate line, extending along the second direction and between the data line and the base substrate. The electrode line extends along the first direction, and a width of a portion of the electrode line overlapping the gate line is smaller than a width of a portion of the electrode line not overlapping the gate line.

At least one embodiment of the present disclosure provides a display device including the display substrate according to any one of embodiments as mentioned above.

At least one embodiment of the present disclosure provides a manufacturing method of a display substrate, including: forming a metal layer on a base substrate and patterning the metal layer to form a data line and an electrode line extending along a first direction; forming an insulation layer on the data line; forming a conductive film on a side of the insulation layer away from the base substrate, and patterning the conductive film to form a second electrode in a light-emitting region and at least one connection portion in a non-light-emitting region; forming a light-emitting layer on a side of the second electrode away from the base substrate, wherein the light-emitting layer covers the second electrode and the connection portion; and forming a first electrode on a side of the light-emitting layer away from the base substrate. The display substrate includes an organic light-emitting element in the light-emitting region, and the organic light-emitting element includes the first electrode, the light-emitting layer and the second electrode which are stacked along a direction perpendicular to the base substrate; and the connection portion is configured to connect the electrode line and the first electrode.

For example, in embodiments of the present disclosure, forming the connection portion includes: forming a first conductive layer and a second conductive layer which are stacked and made of different materials, wherein the first conductive layer is on a side of the second conductive layer away from the base substrate, and a size of the first conductive layer is greater than a size of the second conductive layer along a second direction which intersects with the first direction and is parallel to the base substrate; and the light-emitting layer forming on the first conductive layer is disconnected at a side edge of the first conductive layer, so that the first electrode is connected to the connection portion through a gap where the light-emitting layer is disconnected.

For example, in embodiments of the present disclosure, forming the connection portion further includes: forming a third conductive layer before forming the second conductive layer, forming the second electrode and the connection portion includes: patterning the insulation layer to form a via hole exposing the electrode line; forming a first conductive film on a side of the insulation layer away from the base substrate, the first conductive film being connected to the electrode line through the via hole; patterning the first conductive film to form a first electrode layer in the light-emitting region and the third conductive layer in the non-light-emitting region, wherein a material of the third conductive layer is different from a material of the second conductive layer, and the third conductive layer is connected to the electrode line through the via hole; sequentially forming a second conductive film and a third conductive film on a side of the first conductive film away from the base substrate; patterning the second conductive film and the third conductive film to form a second electrode layer and a third electrode layer in the light-emitting region, and the first conductive layer and the second conductive layer in the non-light-emitting region. The second electrode includes the first electrode layer, the second electrode layer and the third electrode layer, and the first electrode is at least partially connected to a portion, which is not covered by the second conductive layer, of a surface on a side of the third conductive layer away from the base substrate.

For example, in embodiments of the present disclosure, patterning the second conductive film and the third conductive film includes: wet etching the third conductive film to form the second electrode layer and the first conductive layer, and wet etching the second conductive film to form the third electrode layer and the second conductive layer. An etching amount of the second conductive layer is greater than an etching amount of the first conductive layer so that a size of the first conductive layer in the second direction is greater than a size of the second conductive layer in the second direction.

For example, in embodiments of the present disclosure, forming the light-emitting layer includes: evaporating a light-emitting layer material on the first conductive layer, wherein the light-emitting layer material evaporated on a side edge of the first conductive layer is disconnected to form the light-emitting layer including the gap; and forming the first electrode includes: depositing the first electrode on the light-emitting layer by a sputtering mode so that the first electrode is at least connected to the third conductive layer through the gap.

For example, in embodiments of the present disclosure, after forming the second conductive film and before forming the third conductive film, the method further includes: forming a fourth film layer material on the second conductive film, the fourth film layer material being different from the material of the second conductive film and the material of the third conductive film; after patterning the third conductive film, the method further includes: patterning the second conductive film and the fourth film layer material simultaneously or separately to form the second conductive layer and a fourth film layer, wherein a size of the fourth film layer is not greater than the size of the first conductive layer and greater than the size of the second conductive layer in the second direction.

For example, in embodiments of the present disclosure, patterning the second conductive film and the fourth film layer material simultaneously includes: etching the second conductive film and the fourth film layer material simultaneously with a same etching solution, wherein an etching rate of the etching solution to the second conductive film is higher than an etching rate of the etching solution to the fourth film layer material so that the size of the fourth film layer is greater than the size of the second conductive layer.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
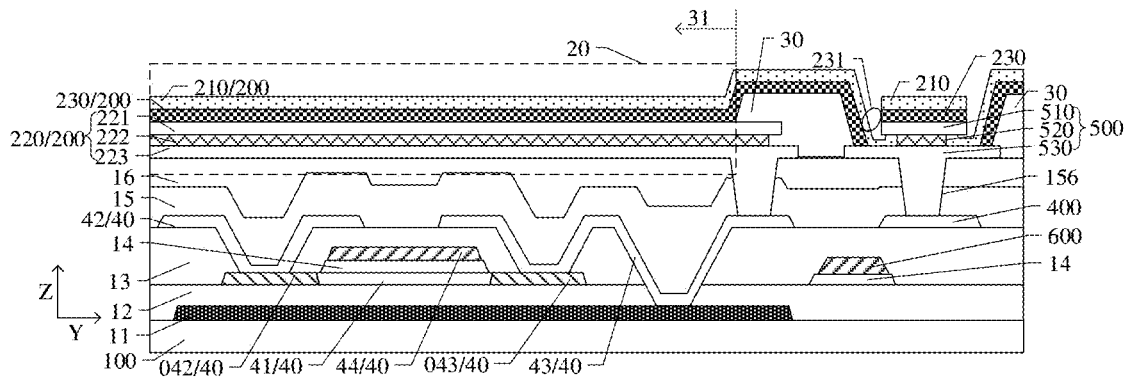
FIG. 1 is a schematic diagram of a partial cross-sectional structure of a display substrate provided by an embodiment of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In a research, the inventor of the present application found that in order to improve a transparency effect of a large-size transparent display product, a thickness of a cathode of an organic light-emitting diode is set very thin, for example, a material of the cathode can be indium zinc oxide (IZO), but setting the thickness of the cathode to be thin will lead to higher resistance of the cathode, which will lead to a problem that the large-size transparent display product are prone to have a larger IR drop. One solution includes connecting the cathode with an auxiliary cathode on a backplane to alleviate the IR drop problem, but how to connect the cathode of the organic light-emitting diode with the auxiliary cathode on the backplane without adding the backplane process is a difficult process.

Embodiments of the present disclosure provide a display substrate, a manufacturing method thereof, and a display device. The display substrate includes a base substrate, organic light-emitting elements, a data line, and an electrode line on the base substrate. The organic light-emitting element includes a first electrode, a light-emitting layer and a second electrode which are sequentially stacked along a direction perpendicular to the base substrate, and the second electrode is on a side of the light-emitting layer facing the base substrate; the data line is located between the base substrate and the organic light-emitting element, and extends along a first direction; the electrode line is on the same layer as the data line and located in a region outside a light-emitting region of the organic light-emitting element. The display substrate further includes at least one connection portion, which is in the region outside the light-emitting region and is configured to connect the electrode line and the first electrode, the connection portion is spaced apart from the second electrode, and the light-emitting layer covers the second electrode and the at least one connection portion. According to the embodiment of the present disclosure, the connection portion is arranged in the display substrate to connect the electrode line and the first electrode of the organic light-emitting element, so that the resistance of the first electrode can be effectively reduced, thereby effectively alleviating the IR drop problem caused by the first electrode.

Next, the display substrate, the manufacturing method thereof and the display device provided by the embodiment of the present disclosure will be described with reference to the attached drawings.

Figure 2:
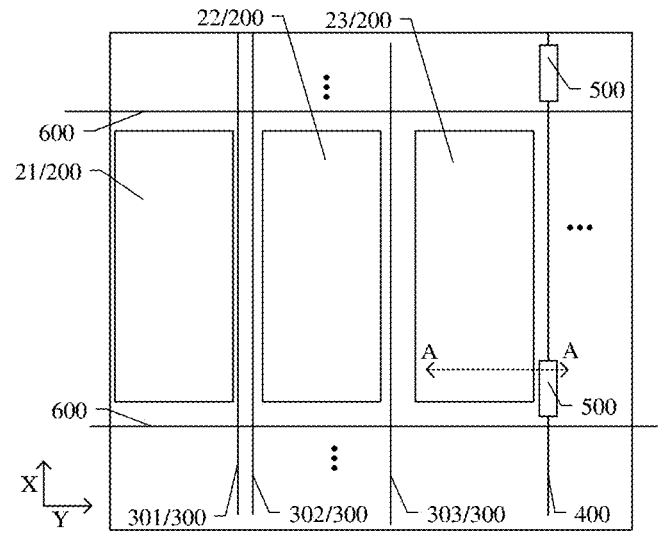
FIG. 2 is a schematic diagram of a partial plane structure of a display substrate provided by an embodiment of the present disclosure.

FIG. 1 is a schematic diagram of a partial cross-sectional structure of a display substrate provided by an embodiment of the present disclosure, and FIG. 2 is a schematic diagram of a partial plane structure of a display substrate provided by an embodiment of the present disclosure. FIG. 1 schematically shows a partial section taken along a line AA in FIG. 2. As shown in FIGS. 1 and 2, the display substrate includes a base substrate 100. A plurality of organic light-emitting elements 200 are disposed on the base substrate 100, each organic light-emitting element 200 includes a first electrode 210, a light-emitting layer 230 and a second electrode 220 which are sequentially stacked along a direction perpendicular to the base substrate 100 (for example, a Z direction in the figure), the second electrode 220 is located on a side of the light-emitting layer 230 facing the base substrate 100, and the first electrode 210 is located on a side of the light-emitting layer 230 away from the base substrate 100. The data line 300 is located between the base substrate 100 and the organic light-emitting element 200, and extends along a first direction (for example, an X direction in the figure). The data line 300 is on the same layer as a part of film layer, which is located on an interlayer insulation layer 13, of the first electrode 42 (one of a source electrode and a drain electrode) and the second electrode 43 (the other of the source electrode and the drain electrode) of a thin film transistor 40 shown in FIG. 1. The electrode line 400 is arranged on the same layer as the data line 300 and located in a region (e.g., a non-light-emitting region) outside a light-emitting region 20 of the organic light-emitting element 200. The display substrate also includes at least one connection portion 500, which is located in the region outside the light-emitting region 20 and configured to connect the electrode line 400 and the first electrode 210, the connection portion 500 is spaced apart from the second electrode 220, and the light-emitting layer 230 covers the second electrode 220 and the connection portion 500. According to the embodiment of the present disclosure, the connection portion is arranged in the display substrate to connect the electrode line and the first electrode of the organic light-emitting element, so that the resistance of the first electrode can be effectively reduced, thereby effectively alleviating the IR drop problem caused by the first electrode.

For example, as shown in FIGS. 1 and 2, the organic light-emitting element 200 may be a top-emitting organic light-emitting diode, and the first electrode 210 and the second electrode 220 may be a cathode and an anode of the organic light-emitting element 200, respectively. For example, the first electrode 210 is a transparent electrode, and the material of the first electrode 210 may be indium zinc oxide (IZO). For example, the thickness of the first electrode 210 may be set thinner to improve a light transmittance.

For example, as shown in FIG. 1, a part of the organic light-emitting element 200 where the first electrode 210, the light-emitting layer 230 and the second electrode 220 are in contact with each other can drive the light-emitting layer 230 to emit light. Therefore, the part of the organic light-emitting element 200 where the first electrode 210, the light-emitting layer 230 and the second electrode 220 are in contact with each other is an effective part where the organic light-emitting element 200 can emit light, thereby forming the light-emitting region 20.

For example, the light-emitting layer here may include an electroluminescent layer itself and other functional layers located on both sides of the electroluminescent layer, such as, a hole injection layer, a hole transport layer, an electron injection layer, and an electron transport layer, etc.

For example, as shown in FIG. 1, the connection portion 500 includes a first conductive layer 510 and a second conductive layer 520 which are stacked in the direction perpendicular to the base substrate 100 and are made of different materials, and the first conductive layer 510 is located on a side of the second conductive layer 520 away from the base substrate 100. Along a second direction intersecting with the first direction and parallel to the base substrate 100 (e.g., a Y direction in the figure), a size of the first conductive layer 510 is greater than a size of the second conductive layer 520, the light-emitting layer 230 is disconnected at a side edge of the first conductive layer 510, and the first electrode 210 is connected to the connection portion 500 through a gap 231 where the light-emitting layer 230 is disconnected.

For example, as shown in FIG. 1, an orthographic projection of the second conductive layer 520 on the base substrate 100 is completely within an orthographic projection of the first conductive layer 510 on the base substrate 100.

For example, as shown in FIG. 1, the orthographic projection of the first conductive layer 510 and the orthographic projection of the second conductive layer 520 on the base substrate 100 fall within an orthographic projection of the light-emitting layer 230, which is located above the first conductive layer 510, on the base substrate 100.

For example, as shown in FIGS. 1 and 2, the embodiment of the present disclosure schematically shows that the first direction and the second direction are perpendicular, but the embodiment of the present disclosure is not limited thereto, and the first direction and the second direction may not be perpendicular. The first direction and the second direction can be interchanged.

For example, as shown in FIGS. 1 and 2, along the Y direction, a length of the first conductive layer 510 is longer than a length of the second conductive layer 520, so that a protruding sharp corner is formed at an upper side edge of the connection portion 500 away from the base substrate 100, and the sharp corner cuts off the light-emitting layer 230 located at the side edge of the first conductive layer 510, so that the light-emitting layer 230 located on the first conductive layer 510 is disconnected off at the side edge of the first conductive layer 510 to form a gap 231. The gap 231 can expose a part of the connection portion 500 covered by the light-emitting layer 230, that is, the gap 231 enables the connection portion 500 to be not completely covered or wrapped by the light-emitting layer 230, so that the first electrode 210 can be connected to the connection portion 500 through the gap 231, thereby realizing the connection between the first electrode 210 and the electrode line 400, and effectively reducing the resistance of the first electrode.

For example, as shown in FIG. 1, the part of the first electrode 210 passing through the gap 231 of the light-emitting layer 230 may extend to an inner side of a lower part of the first conductive layer 510 to be connected to the connection portion 500. For example, the first electrode 210 may overlap the first conductive layer 510 along the direction perpendicular to the base substrate 100.

For example, the electrode line 400 can be called an auxiliary cathode line, which is used to be electrically connected to the cathode of the organic light-emitting element to reduce the resistance of the cathode. For example, the whole structure of the electrode line and the connection portion can be called an auxiliary cathode, which is used to be electrically connected to the cathode of the organic light-emitting element to reduce the resistance of the cathode.

For example, as shown in FIG. 1, the second conductive layer 520 overlaps a middle region of the first conductive layer 510 in the direction perpendicular to the base substrate 100, and a difference between the size of the first conductive layer 510 and the size of the second conductive layer 520 in the second direction ranges from 0.6 to 4 microns.

For example, as shown in FIG. 1, along the second direction, the dimensions of edge parts of the first conductive layer 510 except the portion overlapping with the second conductive layer 520 are approximately the same, that is, the length of the first conductive layer 510 extending out from one side can range from 0.3 to 2 micron, such as, 0.4 to 1 micron, or 0.8 to 1.5 micron. By setting the size of the edge of the first conductive layer beyond the edge of the second conductive layer to 0.3-2 micron, it can be ensured that the light-emitting layer located at the side edge of the first conductive layer is disconnected to form a gap.

For example, as shown in FIG. 1, the display substrate further includes a pixel defining layer 30, the pixel defining layer 30 includes a plurality of openings 31 to define a plurality of light-emitting regions 20. For example, along the second direction, two parts of the pixel defining layer on both sides of the connection portion can be symmetrically distributed, and the organic light-emitting elements on both sides of the connection portion can be symmetrically distributed.

For example, as shown in FIG. 1, the light-emitting layer 230 covers the pixel defining layer 30 and the plurality of openings 31, each opening 31 is configured to define a shape of the light-emitting region 20 of the organic light-emitting element 200. For example, the second electrode 220 (e.g., the anode) of the organic light-emitting element 200 may be disposed between the pixel defining layer 30 and the base substrate 100. The pixel defining layer 30 includes the opening 31 for defining, for example, sub-pixels (including the above-mentioned organic light-emitting element), the opening 31 exposes a part of the second electrode 220. Therefore, in this case, the opening 31 of the pixel defining layer 30 defines the shape of the light-emitting region 20 of the sub-pixel.

For example, as shown in FIG. 1, the pixel defining layer 30 is located between the second electrode 220 and the connection portion 500 to insulate the second electrode 220 and the connection portion 500 from each other.

For example, as shown in FIG. 1, there is a certain distance between the first conductive layer 510 and the pixel defining layer 30 along the second direction. The light-emitting layer 230 is located on the pixel defining layer 30 and the connection portion 500. Because there is a certain distance between the first conductive layer and the pixel defining layer, and the length of the first conductive layer is longer than the length of the second conductive layer to form a protruding sharp corner at the upper side edge of the connection portion, the sharp corner cuts off the light-emitting layer located at the side edge of the first conductive layer, so that the light-emitting layer forms a gap between the pixel defining layer and the connection portion, and the first electrode deposited on the pixel defining layer and the first conductive layer can through the gap and be connected to the connection portion.

For example, the pixel defining layer 30 may have an inclined sidewall, and the distance between the first conductive layer 510 and the pixel defining layer 30 is greater than a sum of a thickness of a part, which is deposited on the sidewall of the pixel defining layer 30, of the light-emitting layer 230 and a thickness of a part, which is deposited on the sidewall of the pixel defining layer 30, of the first electrode 210.

For example, along the direction perpendicular to the base substrate 100, the electrode line 400 may or may not overlap the pixel defining layer 30, and the embodiment of the present disclosure is not limited thereto.

For example, as shown in FIG. 1, the thickness of the second conductive layer 520 is greater than the thickness of the light-emitting layer 230, so that after the light-emitting layer 230 is disconnected at the side edge of the first conductive layer 510, the light-emitting layer 230 not formed on the first conductive layer 510 does not have a connection relationship with the side edge of the first conductive layer 510, that is, the light-emitting layer 230 formed on the pixel defining layer 30 does not have a connection relationship with the side edge of the first conductive layer 510. Therefore, the light-emitting layer forms a gap at the side edge of the first conductive layer.

For example, the thickness of the second conductive layer 520 may be range from 0.5 micron to 0.6 micron, and the thickness of the light-emitting layer 230 is not more than 0.5 micron, such as 0.2-0.4 micron, such as 0.3 micron.

For example, the first electrode 210 may be connected to the second conductive layer 520 through the gap 231 of the light-emitting layer 230.

For example, as shown in FIG. 1, the second electrode 220 of the organic light-emitting element 200 includes at least two electrode layers, such as an electrode layer 221 and an electrode layer 222, and the first conductive layer 510 and the second conductive layer 520 of the connection portion 500 are in the same layer as the two electrode layers in the second electrode 220, such as the electrode layer 221 and the electrode layer 222, respectively, and are insulated to each other.

For example, the connection portion 500 and the second electrode 220 can be formed by a same step process. For example, in the case where both the connection portion 500 and the second electrode 220 include multiple film layers, at least two film layers included in the connection portion 500 can be formed by the same step process as a corresponding film layer included in the second electrode 220.

For example, as shown in FIG. 1, the electrode layer 221 is a film layer, that is in direct contact with the light-emitting layer 230, in the second electrode 220. For example, the electrode layer 221 in the second electrode 220 and the first conductive layer 510 of the connection portion 500 can be formed in the same patterning process using the same material. For example, the material of the electrode layer 221 and the material of the first conductive layer 510 may be indium tin oxide (ITO) or indium tin oxide alloy.

For example, as shown in FIG. 1, the electrode layer 222 is a reflective layer in the second electrode 220. The electrode layer 222 in the second electrode 220 and the second conductive layer 520 of the connection portion 500 can be formed in the same patterning process using the same material, for example, the material of the electrode layer 222 and the material of the second conductive layer 520 can be a metal layer, such as aluminum or silver, etc.

According to the display substrate provided by the embodiment of the present disclosure, the connection portion for connecting the first electrode and the electrode line can be formed on the basis of not increasing the manufacturing process of the display substrate, for example, the first electrode and the auxiliary cathode of the backplane can be connected on the basis of not increasing the manufacturing process of the display substrate, which can not only save the process, but also greatly reduce the IR drop problem of the first electrode, thereby improving the performance and display quality of the display substrate.

For example, as shown in FIG. 1, according to an example of an embodiment of the present disclosure, the connection portion 500 further includes a third conductive layer 530 located on the side of the second conductive layer 520 facing the base substrate 100. The material of the third conductive layer 530 is different from the material of the second conductive layer 520, and the first electrode 210 is at least partially connected to a part, that is not covered by the second conductive layer 520, of the third conductive layer 530. The embodiment of the present disclosure realizes the connection between the first electrode and the electrode line by connecting the first electrode with at least the third conductive layer of the connection portion.

For example, as shown in FIG. 1, the second electrode 220 of the organic light-emitting element 200 includes three conductive layers, such as the electrode layer 221, the electrode layer 222 and an electrode layer 223. The first conductive layer 510, the second conductive layer 520 and the third conductive layer 530 of the connection portion 500 are the same layer as the electrode layer 221, the electrode layer 222 and the electrode layer 223 of the second electrode 220, respectively, and are insulated to each other. For example, the electrode layer 223 in the second electrode 220 and the third conductive layer 530 of the connection portion 500 can be formed in the same patterning process using the same material. For example, the material of the electrode layer 223 and the material of the third conductive layer 530 can be indium tin oxide (ITO) or indium tin oxide alloy, or other conductive materials. The embodiment of the present disclosure is not limited thereto. For example, in the case where the connection portion includes the above three conductive layers, the second electrode may only include two electrode layers (the electrode layer 221 and the electrode layer 222 as shown in FIG. 1).

For example, as shown in FIG. 1, along the direction perpendicular to the base substrate 100, an edge portion of the third conductive layer 530 overlaps the pixel defining layer 30, so that the gap of the light-emitting layer can expose more portions of the third conductive layer.

For example, as shown in FIG. 1, the display substrate includes an insulation layer between the third conductive layer 530 and the electrode line 400, for example, a passivation layer 15 and a planarization layer 16. FIG. 1 schematically shows that the insulation layer includes a passivation layer and a planarization layer, and the planarization layer is located on the side of the passivation layer away from the base substrate. But not limited thereto, a position of the passivation layer and a position of the planarization layer in the insulation layer can be interchanged, or the insulation layer can only include the planarization layer without the passivation layer.

For example, as shown in FIG. 1, a via hole 156 is provided in the insulation layer, and the third conductive layer 530 is connected to the electrode line 400 through the via hole 156. For example, as shown in FIG. 1, the via hole 156 in the insulation layer may include a via hole in the planarization layer 16 and the passivation layer 15. FIG. 1 schematically shows that in the case where the connection portion includes the third conductive layer, the third conductive layer is connected to the electrode line through the via hole, but the embodiment of the present disclosure is not limited thereto. In the case where the connection portion only includes the first conductive layer and the second conductive layer, the second conductive layer can be connected to the electrode line through the via hole in the insulation layer.

For example, in the direction perpendicular to the base substrate 100, the via hole 156 in the insulation layer may overlap the first conductive layer 510 and the second conductive layer 520, or may not overlap the first conductive layer 510 and the second conductive layer 520, the embodiment of the present disclosure is not limited thereto.

For example, in the direction perpendicular to the base substrate 100, the electrode line 400 may overlap the first conductive layer 510 and the second conductive layer 520, or may not overlap the first conductive layer 510 and the second conductive layer 520, the embodiment of the present disclosure is not limited thereto.

Figure 3:
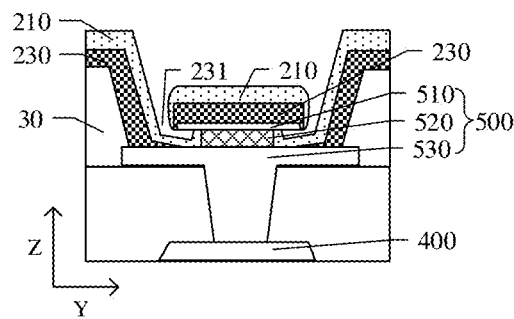
FIGS. 3 and 4 are partial enlarged views of the display substrate as shown in FIG. 1 in different examples, respectively.
Figure 4:
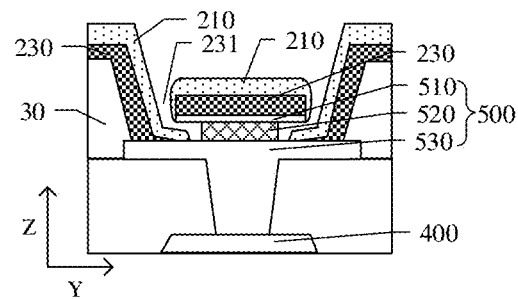

FIG. 3 and FIG. 4 are partial enlarged views of the display substrate shown in FIG. 1 in different examples, respectively. For example, as shown in FIG. 3, the first electrode 210 is connected to a surface of the third conductive layer 530 away from the base substrate 100 and a side surface of the second conductive layer 520. For example, the first electrode 210 may completely wrap the side surface of the second conductive layer 520, or may only be connected to a part of the side surface of the second conductive layer 520, and the embodiment of the present disclosure is not limited to the case.

For example, as shown in FIG. 3, the size of the third conductive layer 530 is greater than the size of the second conductive layer 520 along the second direction. For example, the second conductive layer 520 may be located in a central region of the third conductive layer 530 so that sizes of two regions, which are not covered by the second conductive layer 520, left by the edge portion of the third conductive layer 530 are approximately equal along the second direction.

For example, as shown in FIG. 3, along the second direction, the size of the third conductive layer 530 is greater than the size of the first conductive layer 510, so that the first electrode is more easily connected to the third conductive layer through the gap of the light-emitting layer.

For example, as shown in FIG. 3, the light-emitting layer 230 formed on the first conductive layer 510 can cover the side edge of the first conductive layer 510 while being cut off by the side edge of the first conductive layer 510, but the embodiment of the present disclosure is not limited thereto, and the side edge of the light-emitting layer can also be flush with the side edge of the first conductive layer.

For example, as shown in FIG. 3, the light-emitting layer 230 formed on the pixel defining layer 30 can extend to the central region of the third conductive layer 530, that is, in the direction perpendicular to the base substrate, the light-emitting layer 230 formed on the pixel defining layer 30 can overlap the first conductive layer 510, but this part of the light-emitting layer 230 does not completely cover a part, which is not covered by the second conductive layer 520, of the third conductive layer 530, so that the first electrode 210 can be connected to a part of the third conductive layer 530 which is not covered by the light emitting-layer 230 and the second conductive layer 520. But the embodiment of the present disclosure is not limited thereto, this part of the light-emitting layer can also completely cover the part, which is not covered by the second conductive layer, of the third conductive layer. At this time, the first electrode needs to be connected to the side surface of the second conductive layer.

For example, FIG. 3 schematically shows that a cross-sectional shape of the second conductive layer 520 is rectangular, but the embodiment of the present disclosure is not limited thereto. The cross-sectional shape of the second conductive layer 520 may be trapezoidal, so that the first electrode 210 can easily connect to the side surface of the second conductive layer 520 while covering the surface of the third conductive layer 530 away from the base substrate.

For example, the example as shown in FIG. 4 differs from the example as shown in FIG. 3 in that the first electrode 210 is only connected to the surface of the third conductive layer 530 away from the base substrate, but not connected to the side surface of the second conductive layer 520. At this time, the light-emitting layer 230 formed on the pixel defining layer 30 may or may not overlap the first conductive layer 510 in the direction perpendicular to the base substrate, and this part of the light-emitting layer 230 cannot completely cover a part, which is not covered by the second conductive layer 520, of the third conductive layer 530, so that the first electrode 210 can be connected to the third conductive layer 530.

Figure 5:
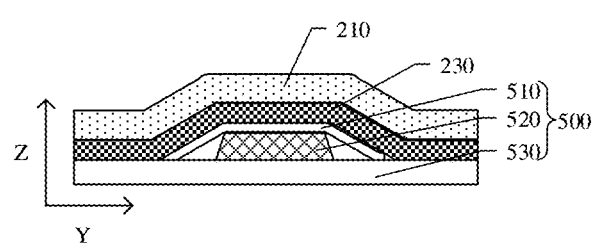
FIG. 5 is a schematic diagram of a partial cross-sectional structure of a display substrate.

In the research, the inventor of this application also found that: in order to match the luminous efficiency and viewing angle color shift of the organic light-emitting device, the thickness of the second electrode 220 is relatively thin (that is, the thickness of the first conductive layer 510 is relatively thin), for example, the thickness of the second electrode 220 may be about 900 Angstrom. In order for the first conductive layer 510 to cut off the light-emitting layer 230 smoothly, it is generally necessary to set a tip, formed by the extended edge, which is relative to the second conductive layer 520, of the first conductive layer 510 to be larger (for example, not less than 0.8 micron). However, at this time, the first conductive layer 510 is prone to be broken. For example, in the case where the thickness of the first conductive layer 510 is thin, and the two side edges of the first conductive layer 510 are longer than the two side edges of the second conductive layer 520, the edge breaking problem as shown in FIG. 5 will occur. At this time, the side edges of the first conductive layer 510 cannot cut off the light-emitting layer 230 formed on the first conductive layer 510, resulting in that the first electrode 210 formed on the light-emitting layer 230 cannot be connected to the connection portion 500 through the gap, so that the first electrode 210 cannot be connected to the electrode line.

Figure 6:
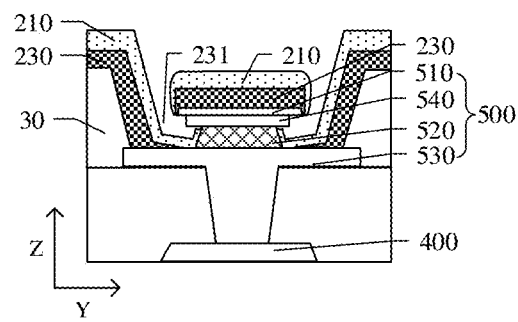
FIG. 6 is a schematic diagram of a partial cross-sectional structure of a display substrate provided by another example of an embodiment of the present disclosure.

FIG. 6 is a schematic diagram of a partial cross-sectional structure of a display substrate provided by another example of an embodiment of the present disclosure. As shown in FIG. 6, the connection portion 500 further includes a fourth film layer 540 between the first conductive layer 510 and the second conductive layer 520, and a material of the fourth film layer 540 is different from the material of the second conductive layer 520 and the material of the first conductive layer 510. Along the second direction, the size of the fourth film layer 540 is not greater than the size of the first conductive layer 510 and is greater than the size of the second conductive layer 520. According to the embodiment of the present disclosure, the fourth film layer is arranged between the first conductive layer and the second conductive layer, which can support the first conductive layer, prevent the edges of both sides of the first conductive layer from breaking, and further ensure that the first electrode can be connected to the connection portion.

For example, as shown in FIG. 6, the fourth film layer 540 can be a conductive layer, for example, the material of the fourth film layer 540 can be a metal, such as, titanium or silver, and so on. For example, along the second direction, the size of the fourth film layer 540 is smaller than the size of the first conductive layer 510. Of course, the embodiment of the present disclosure is not limited to the fourth film layer being a conductive layer, and the fourth film layer may also be a non-conductive layer, for example, the material of the fourth film layer may be a non-conductive material, such as silicon nitride, etc.

For example, as shown in FIG. 6, along the second direction, the difference between the size of the fourth film layer 540 and the size of the second conductive layer 520 ranges from 0.6 to 4 micron. For example, along the second direction, the dimensions of two parts of the edges of the fourth film layer 540 except the part overlapping with the second conductive layer 520 are approximately the same, that is, the length of the fourth film layer 540 (relative to the second conductive layer 520) protruding from one side can range from 0.3 to 2 micron, such as, 0.4-0.8 micron, or 0.3-1.6 micron. For example, along the second direction, the difference between the size of the fourth film layer 540 and the size of the first conductive layer 510 ranges from 0.3 to 2 micron.

According to the embodiment of the present disclosure, by adjusting the dimensional relationship among the first conductive layer, the second conductive layer and the fourth film layer, not only can the light-emitting layer be disconnected at the side edge of the first conductive layer, but also the first conductive layer can be prevented from being broken.

For example, as shown in FIG. 6, the thickness of the fourth film layer 540 is not less than ½ of the thickness of the first conductive layer 510, so that it can better support the first conductive layer and prevent the side edge of the first conductive layer from being broken.

For example, the second electrode may include a film layer, which is the same layer and the same material as the fourth film layer in the connection portion, that is, the second electrode may include four electrode layers, which are in one-to-one correspondence with the four film layers in the connection portion, and the corresponding film layers, which are in the same layer, are formed by one-step patterning process. However, the embodiment of the present disclosure is not limited thereto, and the second electrode may only include the above-mentioned three electrode layers (for example, electrode layers 221, 222 and 223), which are in one-to-one correspondence with the first conductive layer, the second conductive layer and the third conductive layer in the connection portion.

For example, as shown in FIG. 2, the display substrate further includes a gate line 600, the gate line 600 extends along the second direction, and the gate line 600 is located between the data line 300 and the base substrate 100.

Figure 7:
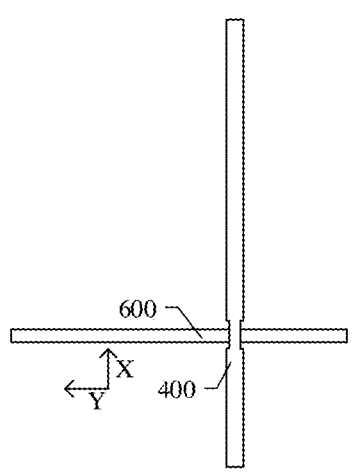
FIG. 7 is a partial structural diagram of the display substrate as shown in FIG. 2.

For example, FIG. 7 is a partial structural diagram of the display substrate as shown in FIG. 2. As shown in FIG. 7, the electrode line 400 extends along the first direction. The electrode line 400 is a long trace, and the electrode line 400 is a thick metal trace, so it has strong conductivity. The first electrode of the organic light-emitting element can solve the IR drop problem of the first electrode by connecting to the electrode line 400, which serves as an auxiliary cathode line.

For example, as shown in FIG. 7, a width of an overlapping portion of the electrode line 400 and the gate line 600 is smaller than a width of a part of the electrode line 400 which does not overlap the gate line 600, so as to reduce the parasitic capacitance generated between them. FIG. 7 schematically shows that by reducing a width at partial positions of the electrode line, a size line width at the overlapping position of the electrode line and the gate line is smaller, but the embodiment of the present disclosure is not limited thereto, and it is also possible to reduce the width at partial position of the gate line so that the size line width at the overlapping position of the gate line and the electrode line is smaller. The embodiment of the present disclosure is not limited thereto, and the width of the overlapping portion of the electrode line and the gate line may be the same as the width of the part that the electrode line does not overlap the gate line.

For example, as shown in FIG. 2, the display substrate includes a plurality of sub-pixels, and each sub-pixel includes an organic light-emitting element 200. For example, as shown in FIG. 2, the display substrate includes a first sub-pixel 21, a second sub-pixel 22 and a third sub-pixel 23. The data line 300 includes a data line 301, a data line 302 and a data line 303, and the first sub-pixel 21, the second sub-pixel 22 and the third sub-pixel 23 are respectively connected to the data line 301, the data line 302 and the data line 303.

Figure 8:
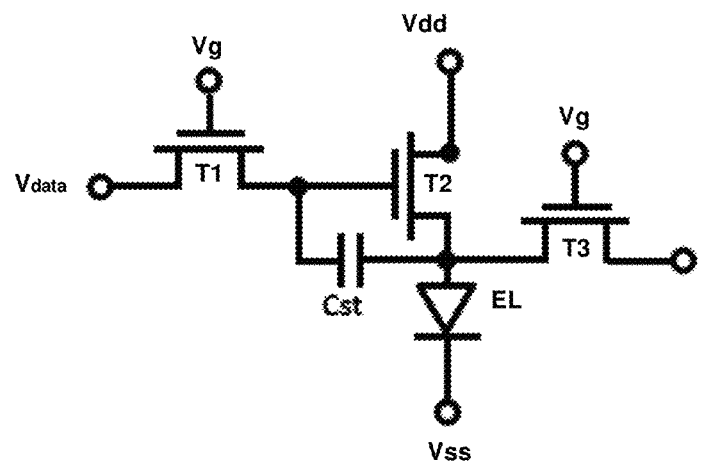
FIG. 8 schematically shows a circuit diagram of a pixel circuit.
Figure 9:
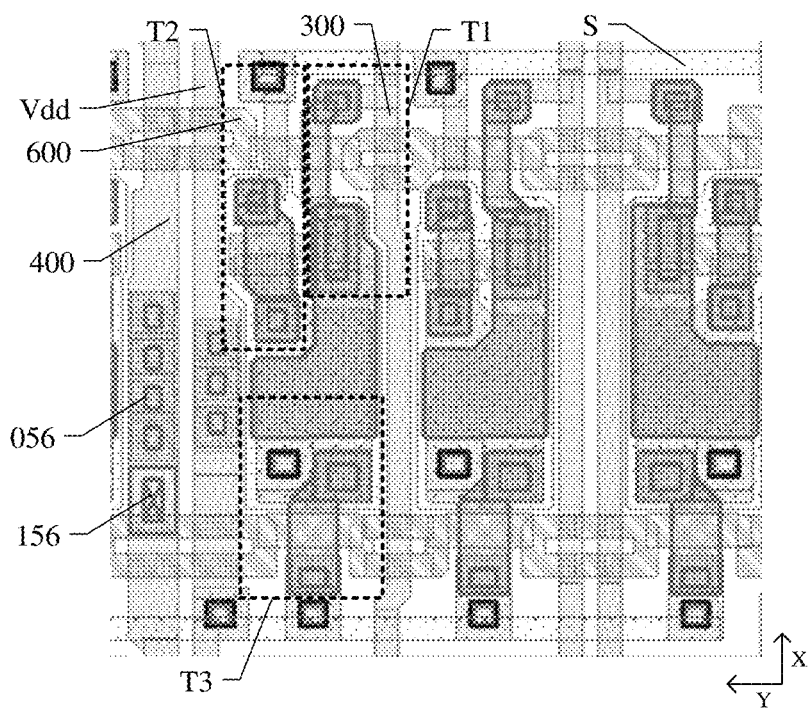
FIG. 9 shows a pixel layout diagram including the pixel circuit as shown in FIG. 8.

For example, each sub-pixel includes the above-mentioned organic light-emitting element and a pixel circuit for driving the organic light-emitting element to emit light. FIG. 8 schematically shows the circuit diagram of the pixel circuit, and FIG. 9 shows the pixel layout diagram including the pixel circuit as shown in FIG. 8. As shown in FIG. 8, the pixel circuit can be a 3T1C pixel circuit, that is, three thin film transistors (TFT) and a storage capacitor Cst are used to drive the organic light-emitting element to emit light. Of course, the pixel circuit in the embodiment of the present disclosure is not limited to the 3T1C pixel circuit, and an amount of thin film transistors and storage capacitors can also be increased. Of course, the pixel circuit of each sub-pixel can also be a 2T1C pixel circuit, that is, the pixel circuit includes a switching transistor, a driving transistor and a storage capacitor.

For example, as shown in FIGS. 8 and 9, the pixel circuit includes a first thin film transistor T1, a driving transistor T2, a second thin film transistor T3, and a storage capacitor Cst. The thin film transistor 40 as shown in FIG. 1 can be the driving transistor T2 as shown in FIG. 7.

For example, as shown in FIGS. 8 and 9, a second electrode of the second thin film transistor T3 is connected to a second electrode of the organic light-emitting element EL; a gate electrode of the driving transistor T2 is connected to a second electrode of the first thin film transistor T1, and a first electrode of the driving transistor T2 is connected to a first voltage terminal Vdd. For example, the first electrode of the driving transistor T2 is connected to the first voltage terminal Vdd by a connection wire S (for example, the connection wire can be in the same layer as a light shielding layer 11 as shown in FIG. 1), and a second electrode of the driving transistor T2 is connected to the second electrode of the organic light-emitting element EL; a first electrode of the storage capacitor Cst is connected to the gate electrode of the driving transistor T2, and a second electrode of the storage capacitor Cst is connected to the second electrode of the driving transistor T2; the first electrode of the organic light-emitting element EL is connected to a second voltage terminal Vss.

For example, the first voltage terminal Vdd is a voltage source to output a constant first voltage, which is a positive voltage; while the second voltage terminal Vss can be a voltage source to output a constant second voltage, which is a negative voltage, etc. For example, in some examples, the second voltage terminal Vss may be grounded.

For example, as shown in FIGS. 8 and 9, a gate electrode of the first thin film transistor T1 is connected to the gate line 600 to receive a scanning signal Vg, a first electrode of the first thin film transistor T1 is connected to the data line 300 to receive a data signal Vdata, and a second electrode of the first thin film transistor T1 is connected to the gate electrode of the driving transistor T2; the first electrode of the driving transistor T2 is connected to a power supply line Vdd (the first voltage terminal) to receive a first voltage Vdd (a high voltage, such as the constant positive voltage), and the second electrode of the driving transistor T2 is connected to the second electrode of the organic light-emitting element EL; the first electrode of the storage capacitor Cst is connected to the second electrode of the first thin film transistor T1 and the gate electrode of the driving transistor T2, and the second electrode of the storage capacitor Cst is connected to the second electrode of the driving transistor T2; the first electrode of the organic light-emitting element EL is connected to the second voltage terminal to receive a second voltage Vss (a low voltage, such as a ground voltage). In the case where the scanning signal is applied through the gate line 600 to turn on the first thin film transistor T1, the data signal Vdata input by the data driving circuit through the data line 300 can charge the storage capacitor Cst through the first thin film transistor T1, so that the data signal Vdata can be stored in the storage capacitor Cst, and the stored data signal Vdata can control a turned-on degree of the driving transistor T2, so that a current flowing through the driving transistor T2 to drive the organic light-emitting element EL to emit light can be controlled, that is, the current determines a gray scale of the sub-pixel.

For example, the first thin film transistor T1 may be a switching transistor and the second thin film transistor T3 may be a compensation transistor.

For example, the second thin film transistor T3 can be a sensing transistor, a first electrode of the second thin film transistor T3 is connected to a detection circuit (not shown) via a sensing line to receive a sensing signal VSEN, thereby realizing the compensation function, and a gate electrode of the second thin film transistor T3 is connected to the gate line 300 to receive the scanning signal Vg. As shown in FIG. 8, after the driving transistor T2 is turned on, the detection circuit can be charged via the second thin film transistor T3, so that a potential of the second electrode of the driving transistor T2 changes. In the case where a voltage Vs of the second electrode of the driving transistor T2 is equal to a difference between a voltage Vg of the gate electrode of the driving transistor T2 and the threshold voltage Vth of the driving transistor T2, the driving transistor T2 is turned off. At this time, after the driving transistor T2 is turned off, the sensing voltage (that is, the voltage Vb of the source electrode after the driving transistor T2 is turned off) can be obtained from the second electrode of the driving transistor T2 via the turned-on second thin film transistor T3. After obtaining the voltage Vb of the source electrode of the driving transistor T2 after the driving transistor T2 is turned off, the threshold voltage Vth=Vdata−Vb of the driving transistor T2 can be obtained, so that compensation data can be established for each pixel circuit based on the threshold voltage of the driving transistor in each pixel circuit, and then the threshold voltage compensation function of each sub-pixel on the array base substrate can be realized.

For example, the second electrode of the second thin film transistor T3 can also input a sensed current of a positive terminal of the organic light-emitting element EL to the detection circuit via the sensing line to obtain the current of the organic light-emitting element EL for emitting light, and then establish compensation data for each light-emitting element based on the current, so as to realize the optical compensation of the organic light-emitting element of each sub-pixel to realize the overall compensation of the uniformity of the display substrate.

For example, at least one of the first thin film transistor T1, the second thin film transistor T3 and the driving transistor T2 may be a top-gate thin film transistor. The top-gate thin film transistor has the characteristics of short channel, so an on-state current Ion of the top-gate thin film transistor can be effectively improved, which can significantly improve the display effect of the display substrate and effectively reduce the power consumption. The overlapping area between the gate electrode and the source and drain electrode of the top-gate thin film transistor is small, so a parasitic capacitance is small.

For example, as shown in FIG. 9, the electrode line 400 can be connected to the film layer in the same layer as the gate electrode through the via hole 056 in the interlayer insulation layer 13, thereby increasing the conductivity of the electrode line, but the embodiment of the present disclosure is not limited thereto, and the electrode line may not be connected to other structures.

For example, as shown in FIG. 9, two branch lines are arranged at the overlapping portion of the gate line 600 with at least one of the electrode line 400, the data line 300 and the power supply line Vdd. In the case where one branch line is short-circuited, the branch line is cut off to realize the transmission of the gate signal through the other branch line, which is convenient for maintenance.

Figure 10:
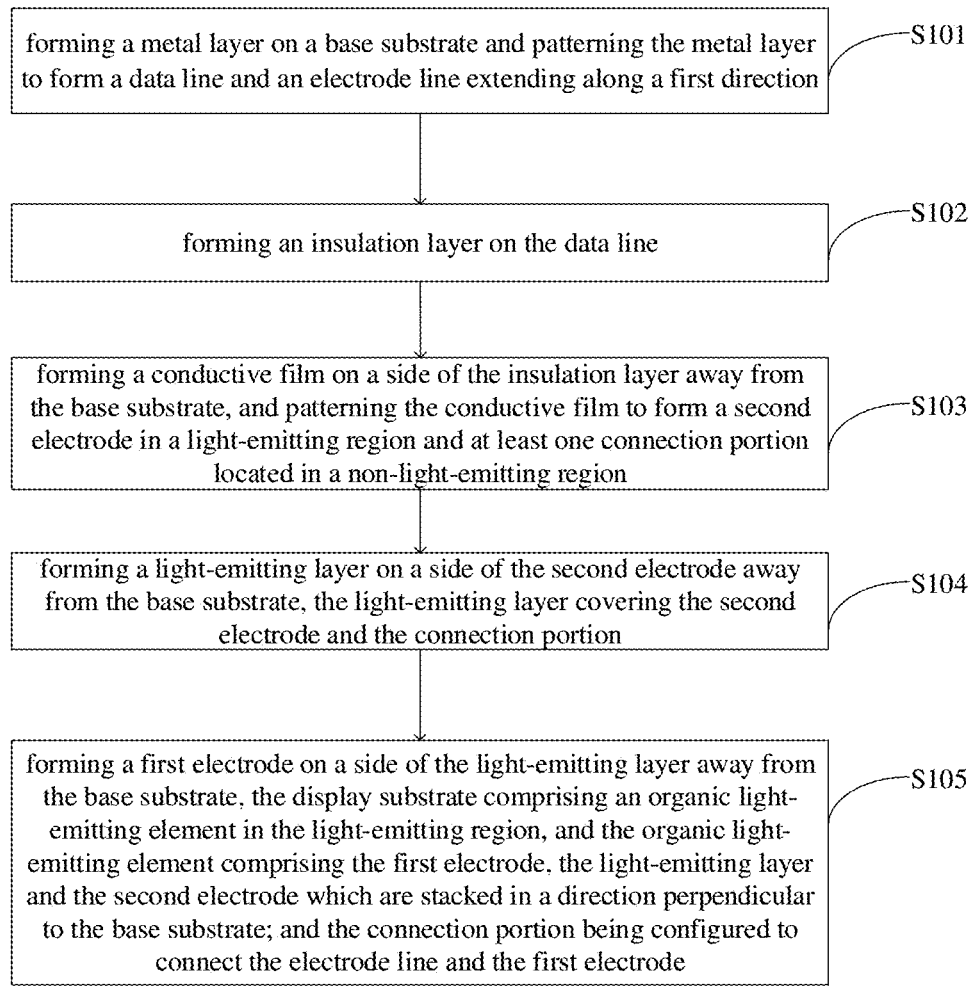
FIG. 10 is a schematic flowchart of a manufacturing method of a display substrate provided by an embodiment of the present disclosure.

The embodiment of the present disclosure provides a manufacturing method of the display substrate as shown in FIG. 1, and FIG. 10 is a schematic flowchart of the manufacturing method of the display substrate provided by the embodiment of the present disclosure, and FIG. 11 to FIG. 16 are manufacturing process diagrams according to the flowchart as shown in FIG. 10. As shown in FIG. 10 to FIG. 16, the manufacturing method includes the following steps.

S101: forming a metal layer on a base substrate and patterning the metal layer to form a data line and an electrode line extending along a first direction.

Figure 11:
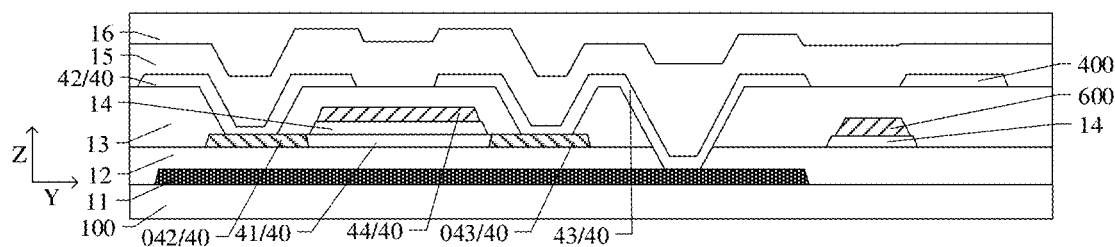
FIGS. 11-16 are manufacturing process diagrams according to the flowchart as shown in FIG. 10.

For example, as shown in FIG. 11, before forming the data line 300 and the electrode line 400, the manufacturing method further includes patterning and forming a light-shielding layer 11 on the base substrate 100, the light-shielding layer 11 is used to shield an active layer 41 in the subsequently formed thin film transistor 40.

For example, as shown in FIG. 11, after the light shielding layer 11 is formed, the manufacturing method further includes forming a buffer layer 12 on the light shielding layer 11.

For example, as shown in FIG. 11, after forming the buffer layer 12, the manufacturing method further includes forming an active semiconductor layer on the buffer layer 12, and patterning the active layer 41 (for example, a channel region) of the thin film transistor 40 and a source region 042 and a drain region 043 of the thin film transistor 40, where the source region 042 and the drain region 043 are the regions after the active semiconductor layer is subjected to the conductive process. Then, a gate insulation layer 14, the gate electrode 44 and the gate line 600 are sequentially patterned on the active layer 41.

For example, as shown in FIG. 11, after forming the gate line 600, the manufacturing method further includes forming the interlayer insulation layer 13 on the gate line 600, and patterning the interlayer insulation layer 13 and the buffer layer 12 to form a via hole exposing the source region 042, the drain region 043 and the light shielding layer 11.

For example, after the interlayer insulation layer 13 is patterned, a metal layer is formed on the interlayer insulation layer 13 and patterned, and a portion, which is in contact with the conductive semiconductor layer of the source region 042 and the drain region 043 of the thin film transistor 40, of the patterned metal layer, are the first electrode 42 and the second electrode 43 (the source electrode 42 and the drain electrode 43), respectively. For example, the second electrode 220 of the organic light-emitting element 200 and the second electrode 43 of the thin film transistor 40 are connected to the light shielding layer 11, and can be used as an electrode of the storage capacitor Cst together to increase the capacitance of the storage capacitor. For example, after patterning the above metal layer, the first electrode 42 and the second electrode 43 of the thin film transistor 40, the data line 300, the electrode line 400, the power supply line Vdd, the sensing line (not shown) and other structures can be formed.

S102: forming an insulation layer on the data line.

As shown in FIG. 11, the manufacturing method includes forming an insulation layer on the side of a film layer, where the data line 300 is located, away from the base substrate 100, for example, the insulation layer includes a passivation layer 15 and a planarization layer 16. FIG. 1 schematically shows that the insulation layer includes the passivation layer and the planarization layer, and the planarization layer is located on the side of the passivation layer away from the base substrate. But not limited thereto, the position of the passivation layer and the position of the planarization layer in the insulation layer can be interchanged, or the insulation layer can only include the planarization layer without the passivation layer.

Figure 12:
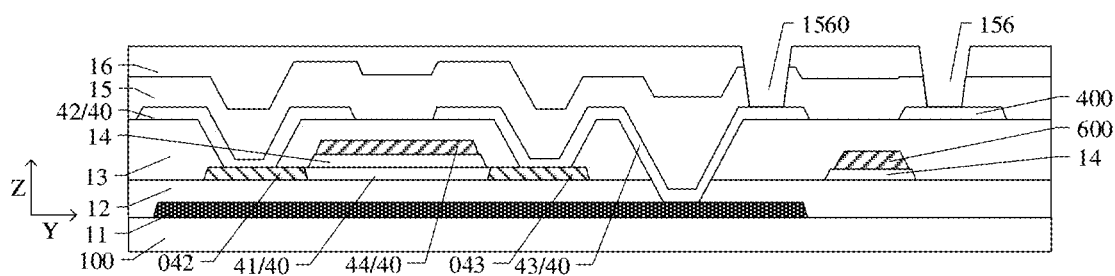

For example, as shown in FIG. 12, the insulation layer is patterned to form a via hole 1560 exposing the second electrode 43 of the thin film transistor 40 and a via hole 156 exposing the electrode line 400.

S103: forming a conductive film on a side of the insulation layer away from the base substrate, and patterning the conductive film to form a second electrode in a light-emitting region and at least one connection portion located in a non-light-emitting region.

S104: forming a light-emitting layer on a side of the second electrode away from the base substrate, the light-emitting layer covering the second electrode and the connection portion.

S105: forming a first electrode on a side of the light-emitting layer away from the base substrate, the display substrate comprising an organic light-emitting element in the light-emitting region, and the organic light-emitting element comprising the first electrode, the light-emitting layer and the second electrode which are stacked in a direction perpendicular to the base substrate; and the connection portion being configured to connect the electrode line and the first electrode.

Figure 13:
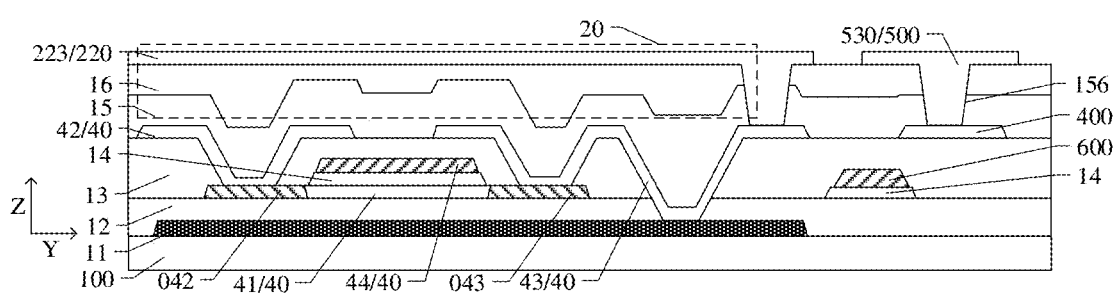

For example, as shown in FIG. 12 and FIG. 13, the manufacturing method of forming the second electrode 220 and the connection portion 500 on the side of the insulation layer away from the base substrate 100 includes: forming a first conductive film on a side of the insulation layer away from the base substrate 100, one part of the first conductive film is connected to the second electrode 43 through a via hole 1560 and the other part of the first conductive film is connected to the electrode line 400 through the via hole 156; patterning the first conductive film to form a first electrode layer 223 (one electrode layer of the second electrode 220) in the light-emitting region 20 and a third conductive layer 530 (one conductive layer of the connection portion 500) in the non-light-emitting region. For example, as shown in FIG. 13, the third conductive layer 530 is connected to the electrode line 400 through the via hole 156.

For example, the first electrode layer 223 of the second electrode 220 and the third conductive layer 530 of the connection portion 500 can be formed in the same patterning process using the same material, for example, the material of the first electrode layer 223 and the material of the third conductive layer 530 can be indium tin oxide (ITO) or indium tin oxide alloy.

Figure 14:
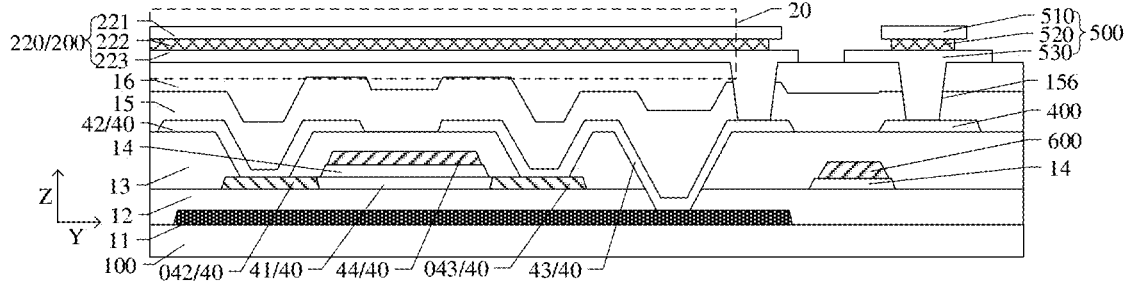

For example, after forming the first electrode layer 223 and the third conductive layer 530, the manufacturing method further includes sequentially forming a second conductive film and a third conductive film on the side of the first electrode layer 223 and the third conductive layer 530 away from the base substrate 100, and the material of the second conductive film is different from the material of the first conductive film and the material of the third conductive film. For example, as shown in FIG. 14, the second conductive film and third conductive film are patterned to form the second electrode layer 221 and the third electrode layer 222 in the light-emitting region 20, and a first conductive layer 510 and a second conductive layer 520 in the non-light-emitting region.

For example, the second electrode layer 221 in the second electrode 220 and the first conductive layer 510 of the connection portion 500 can be formed in the same patterning process using the same material, for example, the third electrode layer 222 of the second electrode 220 and the second conductive layer 520 of the connection portion 500 can be formed in the same patterning process using the same material.

For example, the material of the second conductive film can be an aluminum alloy with a good reflection effect, but the embodiment of the present disclosure is not limited thereto, and the material of the second conductive film can also be other materials with a good reflection effect. For example, the material of the third conductive film may be indium tin oxide alloy.

For example, patterning the second conductive film and the third conductive film includes wet etching the third conductive film to form the second electrode layer 221 and the first conductive layer 510, and wet etching the second conductive film to form the third electrode layer 222 and the second conductive layer 520. An etching amount of the second conductive layer 520 is greater than an etching amount of the first conductive layer 510 so that the size of the first conductive layer 510 along the second direction is greater than the size of the second conductive layer 520 along the second direction. For example, a mask plate forming the first conductive layer 510 and the second conductive layer 520 may be the same mask plate.

For example, $H_2SO_4$ diluted acid can be used to etch the third conductive film to form the second electrode layer 221 and the first conductive layer 510, and $H_3PO_4$ concentrated acid can be used to etch the second conductive film with a larger amount of etching to enable the second conductive film to have a larger indentation, so that the first conductive layer 510 extends outward along the second direction with a longer tip relative to the edge of the second conductive layer 520, which is used to cut off the subsequently formed light-emitting layer.

For example, in the process of etching the third conductive film with $H_2SO_4$ diluted acid, the material of the second conductive film can hardly be etched with $H_2SO_4$ diluted acid, so that the etching process of the third conductive film hardly affects the second conductive film. For example, in the process of etching the second conductive film with $H_3PO_4$ concentrated acid, $H_3PO_4$ diluted acid can hardly etch the material of the third conductive layer 530 and the material of the first electrode layer 223, so that the process of etching the second conductive film hardly affects the third conductive layer 530 and the first electrode layer 223.

For example, the second electrode layer 221 and the third electrode layer 222 formed in the process of forming the first conductive layer 510 and the second conductive layer 520 by wet etching may have the following relationship: the size of the second electrode layer 221 along the second direction is greater than the size of the third electrode layer 222 along the second direction.

Figure 15:
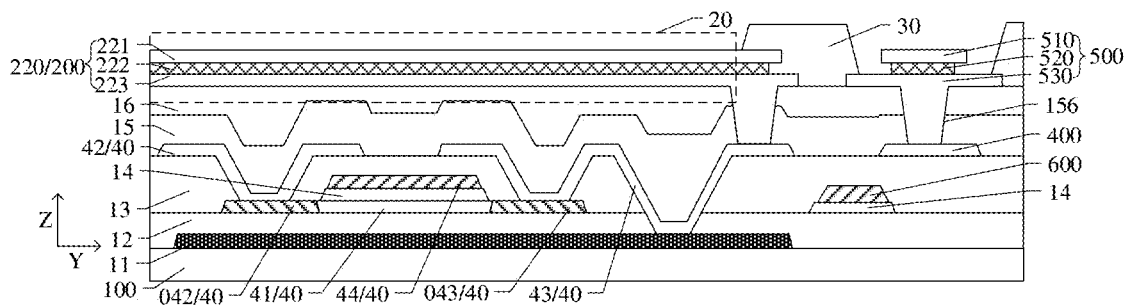

For example, as shown in FIG. 15, after forming the second electrode 220 and the connection portion 500, the manufacturing method further includes forming a pixel defining layer 30 on the second electrode 220 and the connection portion 500 by patterning. The pixel defining layer 30 has the characteristics of the pixel defining layer 30 in the display substrate as shown in FIG. 1, and will not be described in detail herein again.

Figure 16:
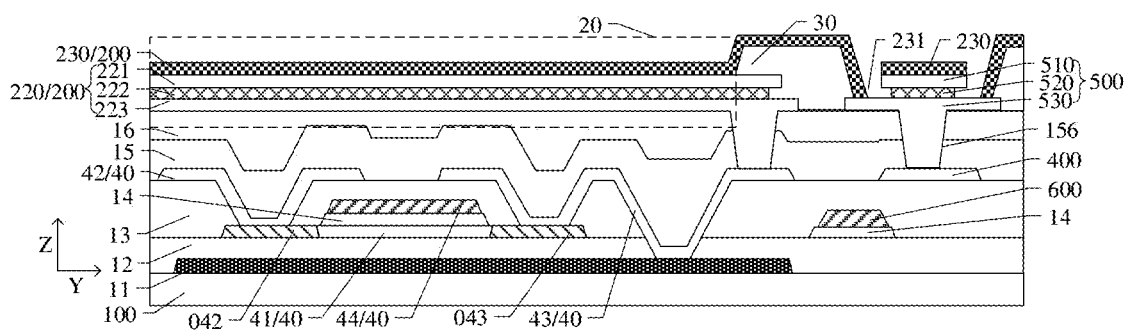

For example, as shown in FIG. 16, after forming the pixel defining layer 30, the manufacturing method further includes forming a light-emitting layer 230 on the first conductive layer 510, the second electrode 220 and the pixel defining layer 30. For example, forming the light-emitting layer 230 includes: evaporating a light-emitting layer material, and the light-emitting layer material deposited on the side edge of the first conductive layer 510 being disconnected to form the gap 231. Because the material of the light-emitting layer 230 is formed on the second electrode, the pixel defining layer and the first conductive layer by evaporation, the diffusion performance of the light-emitting layer material is very poor, the side edge (e.g., the tip) of the first conductive layer can cut off the light-emitting layer and prevent the light-emitting layer from depositing under the side edge of the first conductive layer, that is, the light-emitting layer evaporated on the pixel defining layer and the connection portion forms the gap between the pixel defining layer and the first conductive layer.

For example, as shown in FIG. 1, after forming the light-emitting layer 230, the manufacturing method further includes forming the first electrode 210 on the light-emitting layer 230, and forming the first electrode 210 includes depositing the first electrode 210 on the light-emitting layer 230 by a sputtering method so that the first electrode 210 is connected to at least the third conductive layer 530 through the gap 231. The first electrode 210 formed by the sputtering method has a good diffusion performance, the first electrode 210 can bypass the side edge of the first conductive layer 510 and be deposited on the surface of the third conductive layer 530 away from the base substrate 100 and the side surface of the second conductive layer 520, so that the first electrode 210 and the connection portion 500 can be smoothly connected, and then the first electrode 210 can be connected to the electrode line 400. Of course, the embodiment of the present disclosure is not limited to the first electrode 210 being deposited not only on the surface of the third conductive layer away from the base substrate, but also on the side surface of the second conductive layer. The first electrode may also be deposited only on the surface of the third conductive layer away from the base substrate.

According to the manufacturing method of the display substrate provided by the embodiment of the present disclosure, the electrode line and the source-drain metal layer can be arranged in the same layer, so that the process flow is reduced; moreover, the connection portion and the electrode line serving as the auxiliary cathode are formed below the light-emitting layer, so that the efficiency of the organic light-emitting element does not be affected. After forming the first electrode and the connection portion, the side of the first electrode and the connection portion away from the base substrate is covered with an inorganic protective layer, such as silicon nitride or silicon oxynitride protective layer, to ensure the reliability of the product.

For example, in an example of the embodiment of the present disclosure, after forming the second conductive film and before forming the third conductive film, the manufacturing method further includes: forming a fourth film layer material on the second conductive film; after patterning the third conductive film, the method further includes patterning the material of the second conductive film and the fourth film layer material simultaneously or separately to form the second conductive layer 520 and the fourth film layer 540 as shown in FIG. 6. Along the second direction, the size of the fourth film layer 540 is not greater than the size of the first conductive layer 510 and is greater than the size of the second conductive layer 520.

For example, patterning the second conductive film and the fourth film layer material simultaneously comprises: etching the second conductive film and the fourth film material simultaneously with a same etching solution. An etching rate of the etching solution to the second conductive film is higher than an etching rate of the etching solution to the fourth film layer material so that the size of the fourth film layer is greater than the size of the second conductive layer.

For example, the second conductive film, the fourth film layer material and the third conductive film can be formed on the third conductive layer and the first electrode layer in turn. For example, the fourth film layer material is different from the material of the second conductive film and the material of the third conductive film. For example, the fourth film layer material can be a metal film layer, such as silver or titanium, etc., or a non-metal film layer, such as silicon nitride, etc. In this example, the steps before forming the second conductive film are the same as those shown in FIGS. 11-13, and will not be repeated herein again.

For example, after forming the third conductive film, the manufacturing method may include: firstly etching the third conductive film with $H_2SO_4$ diluted acid to form the second electrode layer 221 and the first conductive layer 510, and then synchronously etching the second conductive film and the fourth film layer material with $H_3PO_4$ concentrated acid with a larger etching amount. Because the etching rate of the fourth film layer material is lower than the etching rate of the material of the second conductive film, the fourth film layer and second conductive layer, which have different lengths along the second direction, are synchronously formed.

According to the embodiment of the present disclosure, the fourth film layer is arranged between the first conductive layer and the second conductive layer, which can support the first conductive layer, prevent the edges of both sides of the first conductive layer from breaking, and further ensure that the first electrode can be connected to the connection portion.

The embodiment of the present disclosure is not limited to the simultaneous etching of the second conductive film and the fourth film layer material, but also different etching solutions can be used for the second conductive film and the fourth film layer material, and the second conductive layer and the fourth film layer can be etched step by step.

For example, in the example, the steps after forming the connection portion including four film layers are the same as those in FIGS. 15-16, and will not be described in detail herein again.

Another embodiment of the present disclosure provides a display device including the display substrate according to any embodiments of the present disclosure. For example, the display substrate may be an array substrate of the display device.

According to the display device provided by the embodiment of the present disclosure, the resistance of the first electrode can be effectively reduced by arranging the connection portion to connect the electrode line and the first electrode of the organic light-emitting element, thereby effectively alleviating the IR drop problem caused by the first electrode.

According to the display device provided by the embodiment of the present disclosure, by arranging the connection portion including the first conductive layer, the second conductive layer, the third conductive layer and the fourth film layer, the light-emitting layer can be disconnected at the side edge of the first conductive layer to realize the connection between the first electrode and the connection portion, and the first conductive layer can be prevented from being disconnected.

The display device provided by the embodiment of the present disclosure can be an organic light-emitting diode display device.

The display device provided by the embodiment of the present disclosure can be a transparent display device.

The display device provided by the embodiment of the present disclosure may further include a cover layer located on a display side of the display substrate to protect the organic light-emitting elements.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A display substrate, comprising:
   a base substrate;
   a plurality of organic light-emitting elements on the base substrate, wherein each organic light-emitting element comprises a first electrode, a light-emitting layer and a second electrode which are sequentially stacked along a direction perpendicular to the base substrate, and the second electrode is on a side of the light-emitting layer facing the base substrate;
   a data line, between the base substrate and the organic light-emitting element, and extending along a first direction; and
   an electrode line, on the same layer as the data line and in a region outside a light-emitting region of the organic light-emitting element,
   wherein the display substrate further comprises at least one connection portion, which is in the region outside the light-emitting region and is configured to connect the electrode line and the first electrode, the connection portion is spaced apart from the second electrode, and the light-emitting layer covers the second electrode and the at least one connection portion;
   the display substrate further comprising:
   a gate line, extending along the second direction and between the data line and the base substrate,
   wherein the electrode line extends along the first direction, and a width of a portion of the electrode line overlapping the gate line is smaller than a width of a portion of the electrode line not overlapping the gate line.

2. The display substrate according to claim 1, wherein the light-emitting layer is disconnected at a side edge of the connection portion, and the first electrode is connected to the connection portion through a gap where the light-emitting layer is disconnected.

3. The display substrate according to claim 1, wherein the first electrode is a transparent electrode, and the connection portion comprises a first conductive layer and a second conductive layer which are stacked in the direction perpendicular to the base substrate and are made of different materials, and the first conductive layer is on a side of the second conductive layer away from the base substrate; and
   in a second direction intersecting with the first direction and parallel to the base substrate, a size of the first conductive layer is greater than a size of the second conductive layer, the light-emitting layer is disconnected at a side edge of the first conductive layer, and the first electrode is connected to the connection portion through a gap where the light-emitting layer is disconnected.

4. The display substrate according to claim 3, wherein the connection portion further comprises a third conductive layer on a side of the second conductive layer facing the base substrate, a material of the third conductive layer is different from the material of the second conductive layer, and the first electrode is at least partially connected to a portion, which is not covered by the second conductive layer, of a surface of the third conductive layer away from the base substrate.

5. The display substrate according to claim 4, wherein, in the second direction, a size of the third conductive layer is greater than the size of the second conductive layer.

6. The display substrate according to claim 4, wherein, in the second direction, a size of the third conductive layer is greater than the size of the first conductive layer.

7. The display substrate according to claim 4, wherein the first electrode is connected to the surface of the third conductive layer away from the base substrate and a side surface of the second conductive layer.

8. The display substrate according to claim 4, wherein the connection portion further comprises a fourth film layer between the first conductive layer and the second conductive layer, and a material of the fourth film layer is different from the material of the second conductive layer and the material of the first conductive layer; and in the second direction, a size of the fourth film layer is not greater than the size of the first conductive layer and greater than the size of the second conductive layer.

9. The display substrate according to claim 8, wherein the fourth film layer is a conductive layer, and the size of the fourth film layer is smaller than the size of the first conductive layer in the second direction.

10. The display substrate according to claim 9, wherein a thickness of the fourth film layer is not less than ½ of a thickness of the first conductive layer.

11. The display substrate according to claim 4, wherein, in the direction perpendicular to the base substrate, the second conductive layer overlaps a middle region of the first conductive layer, and in the second direction, a difference between the size of the first conductive layer and the size of the second conductive layer ranges from 0.6 to 4 microns.

12. The display substrate according to claim 4, wherein, in the direction perpendicular to the base substrate, a thickness of the second conductive layer is greater than a thickness of the light-emitting layer.

13. The display substrate according to claim 4, further comprising:

an insulation layer between the third conductive layer and the electrode line, wherein the insulation layer is provided with a via hole, and the third conductive layer is connected to the electrode line through the via hole.

14. The display substrate according to claim 4, wherein the second electrode of the organic light-emitting element comprises at least two electrode layers, and the first conductive layer and the second conductive layer are respectively in the same layer as the two electrode layers of the second electrode and insulated with each other.

15. A display device, comprising the display substrate according to claim 1.

16. A manufacturing method of a display substrate, comprising:

forming a metal layer on a base substrate and patterning the metal layer to form a data line and an electrode line extending along a first direction;

forming an insulation layer on the data line;

forming a conductive film on a side of the insulation layer away from the base substrate, and patterning the conductive film to form a second electrode in a light-emitting region and at least one connection portion in a non-light-emitting region;

forming a light-emitting layer on a side of the second electrode away from the base substrate, wherein the light-emitting layer covers the second electrode and the connection portion; and forming a first electrode on a side of the light-emitting layer away from the base substrate, wherein the display substrate comprises an organic light-emitting element, the organic light-emitting element comprises the light-emitting region, and the organic light-emitting element comprises the first electrode, the light-emitting layer and the second electrode which are stacked along a direction perpendicular to the base substrate; and the connection portion is configured to connect the electrode line and the first electrode;

the display substrate further comprising:

a gate line, extending along the second direction and between the data line and the base substrate, wherein the electrode line extends along the first direction, and a width of a portion of the electrode line overlapping the gate line is smaller than a width of a portion of the electrode line not overlapping the gate line.

17. The manufacturing method according to claim 16, wherein forming the connection portion comprises: forming a first conductive layer and a second conductive layer which are stacked and made of different materials, wherein the first conductive layer is on a side of the second conductive layer away from the base substrate, and a size of the first conductive layer is greater than a size of the second conductive layer along a second direction which intersects with the first direction and is parallel to the base substrate; and wherein the light-emitting layer forming on the first conductive layer is disconnected at a side edge of the first conductive layer, so that the first electrode is connected to the connection portion through a gap where the light-emitting layer is disconnected.

18. The manufacturing method according to claim 17, wherein forming the connection portion further comprises: forming a third conductive layer before forming the second conductive layer, forming the second electrode and the connection portion comprises:

patterning the insulation layer to form a via hole exposing the electrode line;

forming a first conductive film on a side of the insulation layer away from the base substrate, the first conductive film being connected to the electrode line through the via hole;

patterning the first conductive film to form a first electrode layer in the light-emitting region and the third conductive layer in the non-light-emitting region, wherein a material of the third conductive layer is different from a material of the second conductive layer, and the third conductive layer is connected to the electrode line through the via hole;

sequentially forming a second conductive film and a third conductive film on a side of the first conductive film away from the base substrate;

patterning the second conductive film and the third conductive film to form a second electrode layer and a third electrode layer in the light-emitting region, and the first conductive layer and the second conductive layer in the non-light-emitting region;

wherein the second electrode comprises the first electrode layer, the second electrode layer and the third electrode layer, and the first electrode is at least partially connected to a portion, which is not covered by the second conductive layer, of a surface on a side of the third conductive layer away from the base substrate.

19. The manufacturing method according to claim 18, wherein patterning the second conductive film and the third conductive film comprises: wet etching the third conductive film to form the second electrode layer and the first conductive layer, and wet etching the second conductive film to form the third electrode layer and the second conductive layer, wherein an etching amount of the second conductive layer is greater than an etching amount of the first conductive layer so that a size of the first conductive layer in the second direction is greater than a size of the second conductive layer in the second direction.

\* \* \* \* \*

UNITED STATES PATENT AND TRADEMARK OFFICE
CERTIFICATE OF CORRECTION

PATENT NO. : 12,171,126 B2  
APPLICATION NO. : 17/637504  
DATED : December 17, 2024  
INVENTOR(S) : Ning Liu et al.

Page 1 of 1

It is certified that error appears in the above-identified patent and that said Letters Patent is hereby corrected as shown below:

On the Title Page

Item (73) Assignees should read: HEFEI XINSHENG OPTOELECTRONICS TECHNOLOGY CO., LTD, Anhui (CN); BOE TECHNOLOGY GROUP CO., LTD., Beijing (CN)

Signed and Sealed this
Sixteenth Day of December, 2025

John A. Squires
*Director of the United States Patent and Trademark Office*